United States Patent [19]

Moslehi

[11] Patent Number: 5,168,072
[45] Date of Patent: Dec. 1, 1992

[54] METHOD OF FABRICATING AN HIGH-PERFORMANCE INSULATED-GATE FIELD-EFFECT TRANSISTOR

[75] Inventor: Mehrdad M. Moslehi, Dallas, Tex.

[73] Assignee: Texas Instruments Incorporated, Dallas, Tex.

[21] Appl. No.: 596,839

[22] Filed: Oct. 12, 1990

[51] Int. Cl.⁵ .................................... H01L 21/336
[52] U.S. Cl. ..................... 437/41; 437/44; 437/162; 437/192; 437/193; 257/327
[58] Field of Search ............... 437/24, 27, 28, 29, 437/30, 40, 41, 44, 162, 189, 191, 192, 193; 357/23.3

[56] References Cited

U.S. PATENT DOCUMENTS

| | | | |
|---|---|---|---|
| 4,577,392 | 3/1986 | Peterson | 437/44 |
| 4,740,484 | 4/1988 | Norstrom et al. | 437/44 |
| 4,784,971 | 11/1988 | Chiu et al. | 437/162 |
| 4,907,048 | 3/1990 | Huang | 437/44 |
| 4,945,070 | 7/1990 | Hsu | 437/162 |
| 4,978,626 | 12/1990 | Poon et al. | 437/44 |
| 4,988,632 | 1/1991 | Pfiester | 437/162 |
| 5,032,535 | 7/1991 | Kamijo et al. | 437/44 |
| 5,079,180 | 1/1992 | Rodder et al. | 437/44 |

FOREIGN PATENT DOCUMENTS 0082620 3/1989 Japan ..................... 437/24

OTHER PUBLICATIONS

Ghandhi, *VLSI Fabrication Principles*, John Wiley & Sons, 1983, p. 324.
James R. Pfiester, Richard D. Sivan, H. Ming Liaw, Chris A. Seelbach, and Craig D. Gunderson, "A Self-Aligned Elevated Source/Drain MOSFET" IEEE Electron Device Letters, vol. 11, No. 9, Sep., 1990, pp. 365–367.

*Primary Examiner*—Mary Wilczewski
*Attorney, Agent, or Firm*—Ira S. Matsil; James C. Kesterson; Richard L. Donaldson

[57] ABSTRACT

An improved device fabrication method and transistor structure 36 provide shallow, heavily doped, source-/drain junction regions 64 and a uniformly doped lower gate region 50 having a high concentration of dopants efficiently distributed near the gate electrode/gate interface 51. The gate, source, and drain terminals of transistor 36 may be interconnected to other neighboring or remote devices through the use of reacted refractory metal interconnect segments 98 and 100. Transistor structure 36 of the present invention may be constructed in an elevated source/drain format to include elevated source/drain junction regions 87 which may be fabricated simultaneous with a primary upper gate electrode region 88. This elevated source/drain junction feature is provided without added device processing complexity.

31 Claims, 5 Drawing Sheets

METHOD OF FABRICATING AN HIGH-PERFORMANCE INSULATED-GATE FIELD-EFFECT TRANSISTOR

TECHNICAL FIELD OF THE INVENTION

This invention relates in general to microelectronic devices and integrated circuits, and more particularly to a fabrication method and process flow involving construction and interconnection of a high-performance insulated-gate field-effect transistor (IGFET) having an efficiently doped gate electrode structure and shallow low-resistance source/drain junction regions.

BACKGROUND OF THE INVENTION

In modern integrated circuit technologies, numerous device fabrication methodologies have been provided in order to construct insulated-gate field-effect transistors (IGFETs). IGFET devices have important applications in advanced very-large-scale integration (VLSI) or ultra-large-scale integration (ULSI) circuit environments. In fabricating IGFETs, it has heretofore been recognized as desirable to ensure that the source/drain junction regions of the IGFET are shallow and have low parasitic electrical resistance. In sub-micron transistors where the device channel or gate length is scaled down, it is likewise desirable to properly reduce other lateral and vertical dimensions associated with the transistor. In particular, the source/drain junction depth of the transistor should be reduced. Reduced device dimensions and other scaled physical parameters of the device such as doping profiles must be properly controlled or else undesirable effects may occur in operation of the transistor, resulting in transistor performance degradations.

At least two device performance degradation problems are associated with deep source/drain junction regions in scaled IGFET devices. The first problem is the possibility of a device drain current leakage caused by a phenomenon known as drain-induced barrier lowering (DIBL). DIBL causes increased off-state electrical current leakage through the transistor channel. Theoretically and ideally, no subthreshold drain current should pass through a transistor channel for gate-to-source voltages below the nominal transistor threshold voltage. However, as drain-to-source voltage is increased for a constant gate-to-source voltage below the threshold voltage of the device, DIBL causes the drain current of the device to likewise increase due to a lowering of the effective channel potential barrier. Thus, deeper source/drain junction regions cause DIBL which in turn creates a transistor response which departs from ideal device characteristics. This phenomenon is also known as DIBL-enhanced subthreshold leakage.

A second problem associated with deep source/drain junction regions and also closely associated with subthreshold leakage is the occurrence of punch-through leakage and breakdown underneath the transistor channel. Punch-through leakage occurs where a transistor, although in an off-state condition (gate-to-source voltage below the threshold voltage), leaks from a bulk leakage path produced by the connection or proximity of the depletion regions surrounding the individual doped source/drain junction regions of the transistor. Once this leakage current occurs, the transistor gate is no longer fully controlling the conductivity of the device channel. As a result, the transistor, and any circuit implementing it, may become inoperable or work in a fashion other than that which is desired.

An additional concern in the construction of VLSI and ULSI transistor circuits has been the necessary control and effects of refractory metal and metal silicide contacts to various terminals of individual transistors. Refractory metal or metal silicide contacts to the surfaces of transistor gate and source/drain junction regions are achieved based on a self-aligned technique which is well-known in the art. A trade-off, however, exists in selecting the thickness of the refractory metal or silicide contacts. This trade-off results from two opposing considerations. First, a thick metal silicide contact layer is desirable in order to minimize the effective sheet resistance associated with the transistor source/drain junction and gate regions. For submicron technologies, this consideration is particularly important due to the reduced size and the increased speed expectations of the transistor. Second, a thin refractory metal silicide layer is desired in order to minimize source/drain silicon consumption which occurs due to the reduction of the semiconductor source/drain surface by the thermal silicidation reaction of the refractory metal therewith. This requirement will ensure low junction leakage in source/drain junction regions. Thus, these two opposing considerations must be optimized in constructing a transistor which utilizes refractory metal silicide contacts.

Advanced IGFETs employed in metal-oxide-semiconductor (MOS) technologies usually use a stacked gate structure consisting of a lower layer of doped polycrystalline silicon (or known as polysilicon) and a top layer of refractory metal silicide to lower the overall transistor gate parasitic resistance and gate interconnection delay time. The lower layer of polysilicon is usually doped with arsenic, phosphorus, or boron using furnace doping or ion implantation. It is critical that the gate polysilicon doping should be high and uniform, particularly near the gate electrode/gate dielectric interface. Uniform high doping of a thick polysilicon layer requires a rather high temperature annealing step which can also result in unwanted dopant redistribution in the source/drain junction and channel regions of the transistor. On the other hand, lower temperature annealing steps are favored to maintain shallow source/drain junctions and to prevent dopant (such as threshold voltage adjustment dopant implanted in the channel) redistribution in the device channel; however, lower temperature annealing may result in insufficient dopant redistribution in the gate polysilicon and insufficient doping near the gate electrode/gate dielectric interface. This phenomenon degrades device performance. In addition, excessive thermal anneals not only result in deep source/drain junctions, but may also cause dopant penetration from the gate polysilicon to the device channel region via the gate dielectric. These results degrade process control and device parameter spread by changing the transistor threshold voltage and other characteristics. An improved fabrication method is needed to overcome these trade-offs for high-performance transistor structures.

In an effort to solve problems pertaining to deep source/drain junction regions and the formation of refractory metal silicide contacts, a device known as an elevated source/drain transistor has been heretofore developed. An elevated transistor includes doped source/drain semiconductor regions within the semiconductor substrate (or well) of the device, and elevated doped source/drain semiconductor regions disposed at the surface of the semiconductor substrate and immediately over the doped source/drain junction regions. This elevated source/drain structure reduces the problems associated with deep source/drain junction regions and surface refractory metal silicide connections discussed above. Unfortunately, however, the methodologies heretofore known in the art for constructing elevated source/drain transistors have generated a number of trade-offs. Each of these trade-offs gives rise to manufacturing complexity and limitations in the operability of the device. In particular, thermal annealing processes implemented in the manufacture of the elevated source/drain transistor must be accurately controlled in order to accommodate some of the trade-offs. A failure in controlling these annealing processes may result in an inoperable device or a device with parameters dissimilar to those required or specified for it.

Still another concern in the formation of VLSI and ULSI circuits has been the methods used to interconnect devices which are local to one another. One current method suffers inefficiencies by requiring numerous process steps and wasting excess unreacted materials. An alternative known method is problematic because it utilizes interconnecting materials such as refractory metal nitrides having high electrical resistivity which can reduce the overall circuit speed and limit the distance that the interconnect lines can extend. These methods also rely on complex fabrication techniques which may cause process repeatability problems.

There are often numerous processing steps necessary in order to complete the local interconnect process. A first type of interconnection scheme involves forming refractory metal silicide contacts on the transistor source/drain and gate regions, while discarding, and therefore wasting, any excess material (either reacted with nitrogen or unreacted) which extends beyond the dimensions of the transistor active area. Thereafter, an interlevel dielectric is deposited and metal contact holes are formed therein using standard photolithographic and etching processes. Finally, a metal layer is deposited thereby forming contacts between the top metal layer and the refractory metal silicide regions previously formed. A second type of interconnection scheme involves forming refractory metal silicide contacts on the transistor, and retaining selected portions of metal nitride material which are formed over the field insulating regions during refractory metal silicide formation and which extend beyond the active dimensions of the transistor. These selected portions, usually made of refractory metal nitrides, are used as local interconnects; however, these portions have a high electrical resistivity because they have not reacted with a semiconductor as have the silicide contacts on the transistor gate and source/drain regions. The high electrical resistivity severely limits the practical length and efficiency of this type of local interconnect, particularly in submicron technology.

Therefore, a need has arisen for a method and structure involving the construction and interconnection of a high-performance insulated-gate FET which optimize and accommodate the trade-offs and problems identified above.

SUMMARY OF THE INVENTION

In accordance with the present invention, a method and structure involving construction and interconnection of a high-performance insulated-gate field-effect transistor (IGFET) are provided which substantially eliminate or reduce disadvantages and problems associated with related prior art methodologies and structures.

The present invention includes a method of forming a transistor comprising the step of forming an insulating layer adjacent a semiconductor region. A stacked gate conductor region including first and second conductor regions is formed adjacent the insulating layer and opposite the semiconductor region. Further, implanted source/drain junction regions are formed within the semiconductor region by simultaneously implanting dopants into the first gate electrode region and the semiconductor region.

The methodologies and structure associated with the present invention give rise to numerous technical advantages. A first technical advantage of the present invention is its compatibility with either p or n-channel transistor fabrication processes. Additionally, there is the technical advantage of compatibility with lightly doped drain (LDD) transistor structures and processes. Still another technical advantage of the present invention is a process which permits simultaneous and optimized doping of a transistor gate electrode and source/drain junction regions while accommodating trade-offs associated with the formation of shallow source/drain junction regions and effectively doped gate electrodes. An additional technical advantage of the present invention is the provision of an option for an elevated source/drain transistor structure. This elevated structure provides the technical advantages of controlled shallow effective electrical depth of the source/drain junction regions, reduced device punch-through leakage and drain-induced barrier-lowering device performance degradation effects and the allowance of thick reacted refractory metal semiconductor surface shunts without degrading the effective electrical depth of the source/drain junction regions of the transistor and without enhancing the source/drain junction leakage current density. Still another technical advantage of the present invention is the formation of a high conductivity interconnect between the transistor structure and neighboring as well as remote devices.

BRIEF DESCRIPTION OF THE DRAWINGS

For a more complete understanding of the present invention and for further advantages thereof, reference is now made to the following detailed description taken in conjunction with the accompanying drawings, in which.

DETAILED DESCRIPTION OF THE INVENTION

Figure 1:
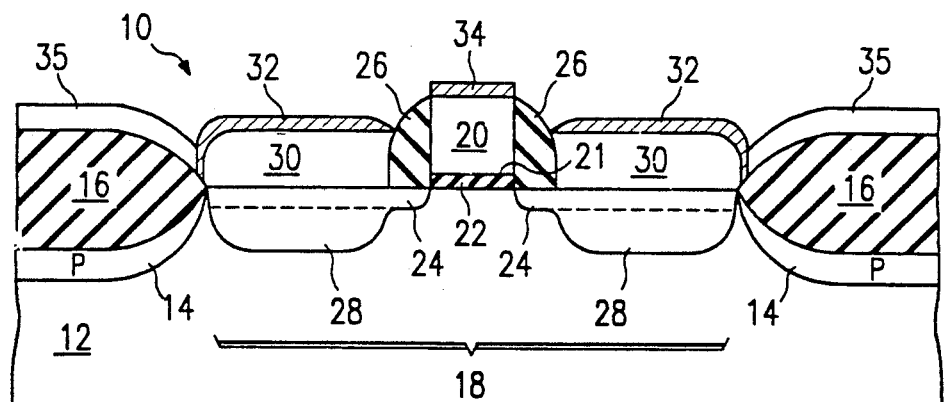
FIG. 1 illustrates a cross-sectional view of a prior art elevated source/drain transistor with silicided gate and source/drain junction regions.

FIG. 1 illustrates a cross-sectional view of a prior art elevated source/drain transistor (IGFET) indicated generally at 10. Transistor 10 is formed over a semiconductor substrate 12, or a doped well region formed within a semiconductor substrate. All the descriptions given herein are for n-channel IGFETs formed within a p-well; however, the structure and fabrication flow for p-channel IGFETs are similar to those of n-channel devices with the exception of opposite dopant types or polarities. P-channel-stop regions 14 and field insulating regions 16 are formed within substrate 12 thereby defining a moat (or active device) region 18 therebetween. Moat region 18 defines the area in which an active transistor device may be formed. A gate conductor 20 is formed over moat region 18 and separated from semiconductor substrate 12 by a thin gate insulator 22, thereby defining a gate conductor/insulator interface 21 therebetween. Gate conductor 20 is typically a doped polysilicon layer on the order of 3000 to 5000 angstroms in thickness. This polysilicon layer is formed by a chemical-vapor deposition (CVD) process. After the formation of gate conductor 20, lightly doped drain (LDD) regions 24 are formed by an ion implantation step which dopes semiconductor substrate 12 between gate conductor 20 and field insulating regions 16.

Sidewall insulator spacers 26 are formed adjacent gate conductor 20. For standard LDD processes, heavily doped source/drain junction regions 28 are implanted into semiconductor substrate 12 between field insulating regions 16 and sidewall insulating spacers 26. Elevated source/drain junction regions 30 are formed at the surface of semiconductor substrate 12 overlying heavily doped source/drain junction regions 28. Thus, the combination of LDD source/drain junction regions 24 and heavily doped source/drain junction regions 28 forms implanted source/drain junction regions and define the "electrical junction depth" for transistor 10.

Refractory metal silicide contacts 32 and 34, typically comprising silicides resulting from the thermal reaction of a refractory metal such as titanium with silicon, are formed over elevated source/drain junction regions 30 and gate conductor 20, respectively. These silicide contacts are formed by a process known as self-aligned silicide (SALICIDE) process based on annealing in a nitrogen, ammonia, or an inert ambient. Excess segments 35 form over field insulating regions 16 as a result of the annealing process used for formation of refractory metal silicide contacts 32 and 34. Typically, excess segments 35 comprise either unreacted titanium or reacted titanium nitride (if titanium is used as the initial refractory metal), or a combination of these two materials.

Prior art elevated source/drain transistor 10 has heretofore included necessary trade-offs in the formation thereof. In particular, two primary competing interests exist in the formation of transistor 10 which should be reconciled in constructing the device. These two primary interests are: (1) maintaining the depth of implanted source/drain junction regions 24 and 28 as shallow as possible; and (2) sufficiently doping gate conductor 20 near conductor/insulator interface 21. The need for establishing each goal and the trade-offs incurred in reconciling these goals are discussed below.

As is known in the art, a conductive material with a suitable work function is preferably utilized for gate conductor 20. A metal material, however, is known to be particularly inappropriate for gate conductor 20 because device reliability and wear-out characteristics could be significantly degraded due to stress and contamination problems which would be present by having a metal gate conductor 20 in contact with gate insulator 22. In some applications, a refractory metal, metal nitride, or metal silicide may be used as gate conductor 20 in direct contact with gate insulator 22 due to work function and device threshold voltage considerations; however, this choice usually results in additional process complexity. Consequently, polysilicon doped to a sufficiently high electrical conductivity has heretofore been well recognized as a suitable material for gate conductor 20. A problem, however, arising from the use of doped polysilicon has been the difficulty in sufficiently doping the entire gate conductor 20 with particular need and emphasis for sufficient heavy doping near gate conductor/insulator interface 21 and at the same time meeting all the processing trade-offs. This interface is well-known and well-characterized for the polysilicon/silicon oxide system, and device performance is directly related to the sufficiency of consistent doping of gate conductor 20 near gate interface 21. The polysilicon gate conductivity can be effectively increased by shunting the gate electrode with a refractory metal or silicide overlayer.

The formation of a sufficiently doped gate conductor 20, having a high concentration and uniform distribution of dopants near interface 21, has heretofore been achieved in one of two ways. First, gate conductor 20 may be doped in a pre-deposition furnace at a time separate from the formation of implanted source/drain junction regions 24 and 28. Second, gate conductor 20 and implanted source/drain junction regions 24 and 28 may be simultaneously doped by an ion implantation and a subsequent high-temperature anneal process. The methodologies of each of these processes and the problems associated with each are discussed below. It should be emphasized that insufficient and/or nonuniform doping of the polysilicon gate electrode 20 near the polysilicon gate/insulator interface 21 can result in device performance and threshold voltage degradations.

Doping of gate conductor 20 and implanted source/drain junction regions 24 and 28 at separate times may be accomplished in one of two ways. The more common method involves constructing gate conductor 20 in three steps. First, an undoped semiconductor layer is formed on top of an insulating layer which, in turn, is on top of semiconductor substrate 12. Second, the undoped layer is doped by placing the device in a furnace and diffusion doping the undoped semiconductor layer. Third, the polysilicon layer is patterned to form gate conductor 20 on gate insulator 22. Thereafter, implanted source/drain junction regions 24 and 28 are formed by known implantation techniques. A second and less popular method of forming a doped gate conductor 20 separate from implanted source/drain junction regions 24 and 28 is accomplished by in-situ doping of the gate conductor layer as the layer is formed. Thereafter, the layer is patterned leaving a doped gate conductor 20 overlying gate insulator 22. Again, implanted source/drain junction regions 24 and 28 are then formed by known implantation and spacer formation techniques.

The in-situ-doped polysilicon deposition processes are not yet as well controlled and optimized as the implantation-doped or diffusion-doped polysilicon conductor formation processes. Further, problems arise due to the process difficulties associated with high levels of in-situ doping. In-situ doping can affect important deposition kinetics and polysilicon layer physical parameters. Moreover, in-situ-doped polysilicon deposition processes may incorporate relatively high levels of carbon in deposited films due to organic dopant source gases.

Each of the two above-discussed methods for doping polysilicon gate conductor 20 in a process step separate from implanted source/drain junction regions 24 and 28 have downsides associated therewith. In particular, the separate doping steps necessarily require additional processing steps which increase the time consumption and manufacturing cost associated with fabricating the device. Further, the subsequent formation of implanted source/drain junction regions 24 and 28 requires an additional thermal annealing step for dopant activation which will further drive in, or redistribute, dopants which have been implanted in the transistor channel before formation of gate conductor 20. These dopants are typically placed in the channel by ion implantation in order to adjust the device threshold voltage and prevent DIBL effects and punch-through leakage. Any subsequent redistribution or deepening of the dopants in the channel may cause undesirable effects in the device characteristics. The dopant redistribution effects are even greater when gate doping is done by furnace doping after deposition of the undoped polysilicon layer. This increase is due to the added thermal treatment steps.

As mentioned above, gate conductor 20 and implanted source/drain junction regions 24 and 28 may be doped simultaneously using the same dopant ion implantation step. This process typically involves depositing an undoped polysilicon layer over an insulating gate dielectric layer which has been formed on the surface of semiconductor substrate 12. Thereafter, standard integrated circuit fabrication processes including microlithography and plasma etch are implemented to pattern the gate conductor 20 over gate insulator 22. Subsequent thereto, a suitable dopant such as arsenic, phosphorus or boron (usually n-type for n-channel and p-type dopant for p-channel devices) is utilized to dope both gate conductor 20 and the exposed areas of semiconductor 12, thereby forming ion implanted source/drain junction regions 24 and 28 at the same time as doping gate conductor 20. The ion implantation step is then followed by a thermal annealing step to uniformly dope gate conductor 20 and also activate dopant atoms in source/drain junction regions 24 and 28.

The method of simultaneously doping gate conductor 20 and implanted source/drain junction regions 24 and 28 also carries with it numerous disadvantages and serious trade-offs. As is known in the art, it is desirable to minimize the depth of implanted source/drain junction regions 24 and 28. In order to maintain shallow junction depths for these regions, a fairly low implant energy, typically on the order of 10 to 50 keV, is necessary in advanced submicron technologies. These low energies will implant dopants to shallow levels; however, this level is usually insufficient to drive the dopants through the depth of gate conductor 20 to the region where dopants are needed near interface 21. Moreover, a fairly low-energy dopant ion implantation is preferred in order to prevent penetration of the implanted dopant profile tail into the gate dielectric and device channel region. As a result, a subsequent high-temperature annealing step is necessary in order to activate the dopants previously implanted in source/drain junction regions 24 and/or 28, and to uniformly distribute the dopant atoms throughout gate conductor 20. This annealing process, however, must be carefully controlled so that the annealing temperature does not exceed certain upper thresholds or there may be device performance degradation. Further, the time period for the anneal must be controlled because a longer duration will cause the dopants to go too deep into the device, thereby forming deep implanted source/drain junction regions 24 and/or 28 and possibly driving dopants through gate electrode/dielectric interface 21 into gate insulator 22 and into the device channel, both of which would have undesirable effects on the ultimate electrical characteristics of the IGFET device. Thus, the method of simultaneously doping gate conductor 20 and source/drain junction regions 24 and 28 seemingly requires a well-controlled and balanced process involving low energy ion implantation followed by an annealing process with optimum temperature and duration.

Opposing considerations, however, contradict the needs for low ion implantation energy, temperature and time period for the post-implant anneal. In order to effectively and uniformly distribute dopants through entire gate conductor 20 toward interface 21, the post-implant thermal anneal of the device must be sufficiently large in order to evenly distribute the dopants. As mentioned above, a failure to do so will cause poor device performance including reduced transconductance or device gain. In addition, the thickness of gate conductor 20 (typically 3000-5000 angstroms) necessarily requires a longer thermal treatment in order to drive the implanted dopants to the area near interface 21, particularly when a relatively low ion implantation energy is used. Thus, it may be appreciated that there is a serious trade-off incurred when gate conductor 20 and implanted source/drain junction regions 24 and 28 are simultaneously doped because the formation of the former favors larger implantation energies, annealing temperatures and time periods, while formation of the latter requires lesser implantation energies as well as smaller annealing temperatures and time periods. It should also be mentioned that although uniform gate doping favors higher implant energies and stronger post-implant anneals, these process parameters should not be too high to cause dopant penetration into gate insulator 22 and into the device channel.

Additional considerations concerning elevated source/drain transistor 10 of FIG. 1 also arise with respect to excess segments 35. In particular, excess segments 35 are commonly formed simultaneously with the formation of reacted refractory metal silicide contacts 32 and 34. These regions are formed as a result of the sputter deposition of a thin refractory metal such as titanium or tungsten and a subsequent annealing step in a nitrogen or ammonia ambient. The refractory metal titanium reacts with the semiconductor materials of elevated source/drain junction regions 30 and gate conductor 20, thereby forming electrically conductive reacted silicide regions for refractory metal silicide contacts 32 and 34, respectively. Excess segments 35 are portions of either unreacted titanium or titanium nitride. These segments form over insulating layers due to the reaction between the deposited titanium and the nitrogen or ammonia ambient. This process is referred to as the self-aligned silicide or "SALICIDE" technique.

The prior art has treated excess segments 35 in one of two ways. First, excess segments 35 (as well as excess metal and metal nitride ears left over sidewall insulator spacers 26 which are not shown in FIG. 1) are entirely removed and a subsequent metalization process is used to make needed connections to refractory metal contacts 32 and 34 (and to provide overall circuit interconnections). In particular, after excess segments 35 (and sidewall ears) are removed, an interlevel dielectric layer is formed over transistor 10 and contact holes are made within the dielectric layer. Thereafter, a metal layer is formed over the interlevel dielectric layer and metal contacts are made through the contact holes, thereby making connections to transistor 10. The second approach to treating excess segments 35 is based on the use of a titanium nitride layer over field insulating regions 16 and operable as extended source/drain and gate contacts. After the silicide formation annealing process, the titanium nitride material over any insulating regions is patterned and etched and the remaining patterned portions are employed as local interconnects. These local interconnects, based on refractory metal nitrides, have poor electrical conductivity, and therefore can cause device interconnection delays and are only practical to interconnect over short distances (e.g. less than 20 $\mu m$ in 1-$\mu m$ technologies). Another potential limitation of these "SALICIDE" techniques is the need for a high-selectivity dry etch process which can remove the excess refractory metal nitride segments without removing the metal silicide and insulating oxide layers. These etch processes are usually difficult to develop.

In light of the above, it is clear that the methodologies known in the prior art to construct transistor 10 and interconnect the same give rise to numerous trade-offs. Further, potential process complexities and device performance limitations must be carefully examined in order to provide an optimum device. The present invention, however, provides a novel device fabrication process flow and structure allowing the simultaneous optimized doping of a gate conductor and implanted source/drain junction regions while accommodating all the trade-offs and considerations mentioned above. In particular, the present invention accommodates the aforementioned trade-offs, permits dopants to be driven sufficiently and uniformly near the gate conductor/insulator interface and maintains shallow implanted source/drain junction regions. Further, an efficient and advantageous interconnection method and fabrication process flow are provided.

The preferred embodiments of the present invention are illustrated in FIGS. 2-19 of the drawings, like numerals being used to refer to like and corresponding parts of the various drawings.

Figure 2:
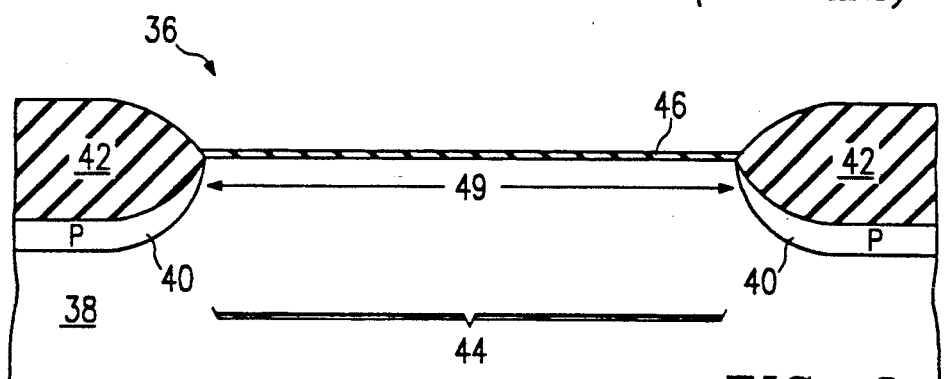
FIG. 2 illustrates a cross-sectional view of a semiconductor substrate (or doped well) having a moat or active region surrounded by thick field insulating regions defining a moat region for constructing a transistor.

FIG. 2 illustrates a cross-sectional view of a transistor structure constructed in accordance with the present invention and indicated generally at 36. Transistor structure 36 (all descriptions are for an n-channel IGFET) includes a semiconductor substrate 38 having p-channel stop regions 40 and field insulating regions 42 formed thereon. Semiconductor substrate 38 may comprise a substrate, or alternatively may be a doped semiconductor well (p-well for n-channel and n-well for p-channel devices) formed within a semiconductor substrate. Semiconductor substrate 38 (or the associated doped well) is preferably silicon, and for illustrative purposes, is p-type silicon. It should be noted that while the present example will describe an n-channel transistor, the present invention is also applicable to p-channel devices when the dopant types or polarities are reversed.

Regions 40 and 42 are generally constructed with photolithographic processes to define a moat area 44 which is where the active device subsequently may be constructed. P-channel-stop regions 40 and field insulating regions 42 are formed in accordance with well-known processes utilized to improve device-to-device isolation. In particular, field insulating regions 42 may be formed by the so-called local-oxidation-of-silicon (LOCOS) or the poly-buffered LOCOS process. Other processing techniques may also be used instead of conventional LOCOS or poly-buffered LOCOS (PBL) in order to form scaled insulating and moat regions 42 and 44. A sacrificial insulating layer 46 is formed at the surface of semiconductor substrate 38 and between field insulating regions 42 by a process such as thermal oxidation. Sacrificial insulating layer 46 is preferably a grown oxide layer on the order of 200 to 400 angstroms in thickness. Any additional implants, such as threshold voltage adjustments or punch-through prevention ion implants, also may be performed into the moat surface region 49 after the formation of sacrificial insulating layer 46. The growth of sacrificial insulating layer 46 helps to eliminate any residual surface damage due to the isolation process flow.

Figure 3:
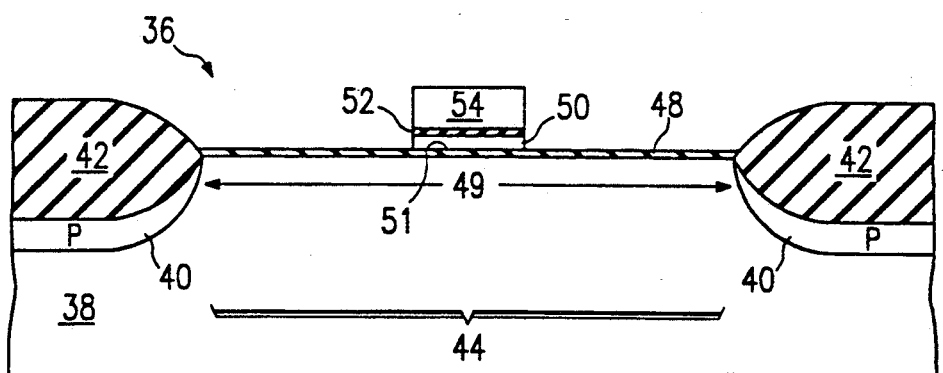
FIG. 3 illustrates a cross-sectional view of an initial gate structure including a lower gate region and a disposable upper gate region placed over a gate dielectric layer.

FIG. 3 illustrates a cross-sectional view of transistor structure 36 following the formation of an initial multi-layer gate electrode stack including a lower gate region 50, an interim gate etch-stop layer 52 and a disposable upper gate region 54. Sacrificial layer 46 illustrated in FIG. 2 is removed by either a wet or damage-free dry isotropic etch. A gate insulating layer 48 is formed at the surface of semiconductor substrate 38 between field insulating regions 42. Insulating layer 48 operates as a gate dielectric for transistor structure 36. Gate insulating layer 48 is preferably a thermally grown oxide layer on the order of 100 angstroms in thickness. Other gate dielectric materials such as silicon nitride or nitrided oxides may also be used. Gate insulating layer 48 is preferably amorphous, but also may be single crystal, in structure (if epitaxial insulators such as $CaF_2$ or sapphire are used).

A three-layered gate stack structure, including a lower gate region 50, an interim gate etch-stop layer 52 and a disposable upper gate region 54, is formed over gate insulating layer 48. Preferably, the gate structure is formed as follows. A thin semiconductor layer such as polysilicon, amorphous silicon, silicon-germanium alloy or germanium is deposited at a thickness on the order of 1000 angstroms. The thin semiconductor layer defines a gate conductor/insulator interface 51 between itself and gate insulating layer 48. A thin etch-stop layer, such as silicon oxide on the order of 10–100 angstroms in thickness, is formed overlying the thin semiconductor layer by thermal oxidation or chemical-vapor deposition (CVD). Finally, a thick material layer, such as a semiconductor layer consisting of either polysilicon or amorphous silicon or silicon-germanium alloy or germanium, is deposited at a thickness on the order of 4000 angstroms over the thin insulating layer. The disposable upper gate region may also be another material such as a suitable insulator. However, a semiconductor material is the preferred choice.

The three-layer structure is patterned in accordance with known photolithographic and plasma etch processes, thereby yielding the structure shown in FIG. 3. The etching step is preferably accomplished by an anisotropic plasma (e.g. reactive-ion etch or RIE, magnetron-ion etch or MIE, or ECR plasma etch) with a silicon to oxide selectivity usually greater than 40 to 1. This high selectivity is chosen in order to properly etch the lower semiconductor layer 50 in the gate stack without fully etching through gate insulating layer 48. Thus, the etch selectivity and over-etch time should be properly controlled in order to prevent penetration through gate insulating layer 48. The thin etch-stop layer 52 may be removed by using an alternative in-situ etch process after etching through the disposable upper gate layer 54. The second etch step during the three-step etch (preferably in-situ) sequence for gate definition effectively etches through etch-stop layer 52 without causing any line width loss or undercut on semiconductor layers 54 and 50.

As mentioned earlier, it should be noted that both the thin and thick semiconductor layers may comprise alternative semiconductor materials. Such materials include, but are not limited to, silicon-germanium, polycrystalline germanium, polycrystalline silicon-germanium and amorphous germanium. It should also be noted that the deposition of all three of the above-mentioned layers is preferably accomplished by an in-situ process; that is, all three layers may be formed by an in-situ multi-step process in the same process equipment without having to remove the wafer from the process chamber in order to form the thin etch-stop oxide layer between the upper and lower semiconductor layers. Disposable upper gate layer 54 may be another material instead of silicon. Other choices include doped CVD oxide layers such as PSG, BSG, and BPSG as well as silicon nitride. Etch-stop layer 52 may consist of etch-blocking materials other than silicon oxide.

Figure 4:
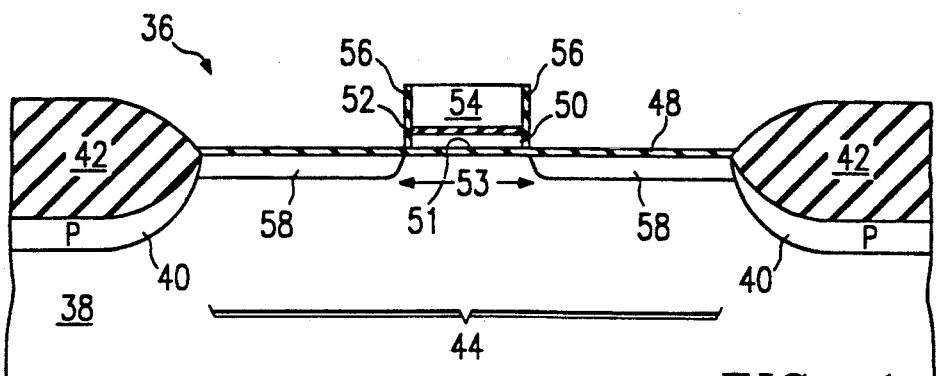
FIG. 4 illustrates a cross-sectional view of the initial gate structure having primary thin sidewall spacers and lightly doped source and drain junction regions.

FIG. 4 illustrates a cross-sectional view of transistor structure 36 following the formation of first sidewall spacers 56 and lightly-doped drain (LDD) source/drain junction regions 58 which define a channel region 53. Sidewall spacers 56 are an insulating material such as silicon oxide or silicon nitride formed on the sidewalls of gate regions 50, 52 and 54 by one of two preferred methods. First, an oxide layer may be thermally grown on the sidewalls to a thickness of 30 to 200 angstroms. Alternatively, an oxide or nitride layer may be deposited using a low-pressure chemical-vapor deposition (LPCVD) process followed by a short reactiveion etch (RIE) cycle. Either process results in insulating sidewall spacers 56 as shown in FIG. 4. Oxide or nitride sidewall spacers 56 are preferably amorphous in structure.

LDD source/drain junction regions 58 are formed by an ion implantation process. The LDD implantation dose is optimized for device reliability and improved breakdown voltage performance without significantly degrading the device gain. In particular, dosage is typically on the order of 5E12 to $1E14/cm^2$, and preferably $5E13/cm^2$. The ion energy level for implantation is 15 to 50 keV, and preferably 25 keV. In the example of an n-channel transistor, a common dopant may be arsenic, phosphorus or antimony. It should be noted that n-type dopants are preferably used for n-channel polysilicon gate devices in order to maintain a desirable work function and device threshold voltage for the gate electrode. This choice further ensures that the transistor will operate as a surface-channel device rather than as a buried-channel device without a need for high-dose threshold adjustment channel ion implantation. LDD source/drain junction regions 58 are a preferable option provided with the present invention; however, LDD technology need not be included in a transistor under the present invention. Thus, the present invention alternatively may be constructed with conventional device source/drain processes. No high-temperature annealing process is necessary in order to activate the LDD junction 58 following the LDD ion implantation step.

Figure 5:
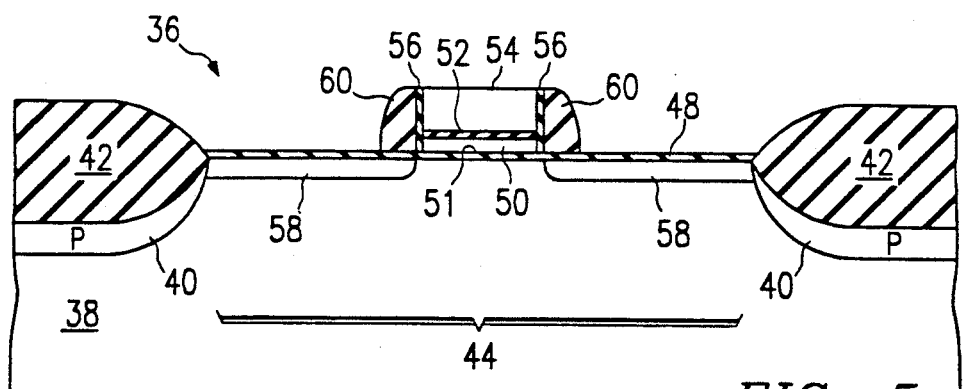
FIG. 5 illustrates a cross-sectional view of the initial gate structure with secondary sidewall spacers before removing the disposable upper gate region.

FIG. 5 illustrates transistor structure 36 following the formation of secondary sidewalls spacers 60. Secondary sidewall spacers 60 are formed by depositing and etching an insulating layer on the order of 500 to 2500, and preferably 1500 angstroms in thickness. Preferably, the deposited layer is silicon-nitride or silicon oxide deposited by an LPCVD process. Thereafter, an RIE is performed to remove the silicon nitride or silicon oxide from flat surfaces, thereby leaving secondary sidewall spacers 60 as illustrated. If silicon nitride is used to form insulating spacers 60, a nitride to oxide selectivity greater than 10 to 1 is used in the RIE, thereby permitting complete removal of nitride from flat surfaces without removing gate insulating layer 48 (assuming silicon oxide is used for the gate dielectric). The etch selectivity and RIE over-etch time must be accurately controlled in order to properly and anisotropically etch the silicon nitride layer without etching through gate insulating layer 48 which would expose LDD source/drain junction regions 58 to a subsequent silicon etch process. Secondary sidewall spacers 60 are preferably amorphous in structure.

Figure 6:
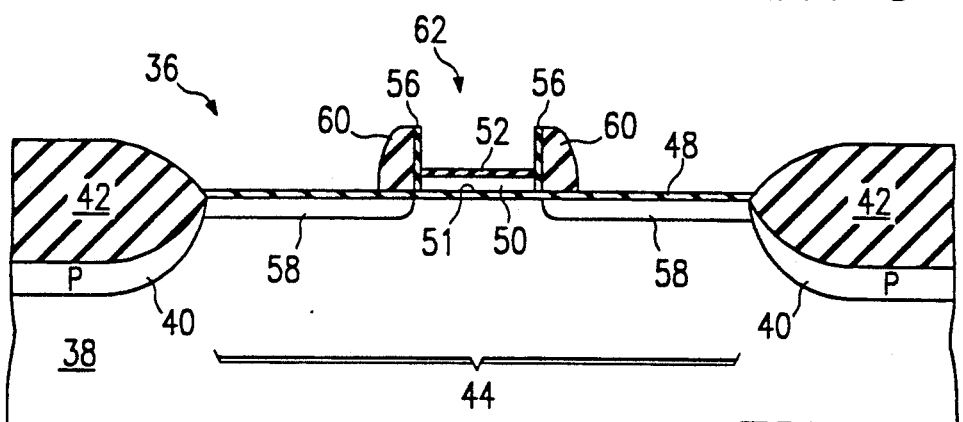
FIG. 6 illustrates a cross-sectional view of the transistor structure after removing the disposable upper gate region.

FIG. 6 illustrates transistor structure 36 following the complete selective removal of previously existing disposable upper gate region 54. After the formation of secondary sidewall spacers 60, an isotropic etch having a high silicon-to-oxide and/or silicon-to-nitride selectivity on the order of 100 to 1 is performed. This etching process removes disposable upper gate region 54 (see FIG. 5). The etch stops on interim gate etch-stop region 52 and defines a gate trench area 62 between sidewall spacers 56 and over interim gate etch-stop region 52.

Figure 7:
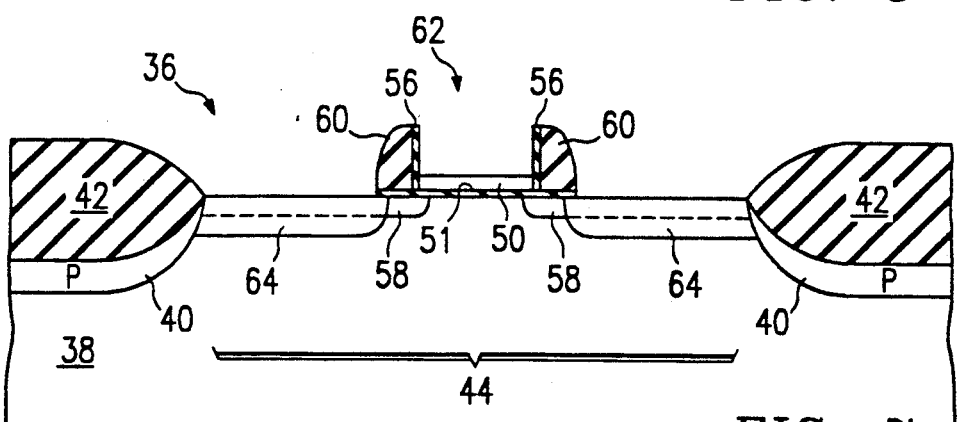
FIG. 7 illustrates a cross-sectional view of the present invention including heavily doped source/drain junction regions after an ion implantation process to dope the lower gate and source/drain regions and after removing the gate etch-stop layer.

FIG. 7 illustrates a cross-sectional view of transistor structure 36 following the formation of heavily doped shallow source/drain junction regions 64. An implantation step is performed at optimum dose and energy which simultaneously forms heavily doped source/drain junction regions 64 and dopes lower gate region 50. Again, common examples of n-channel transistor dopants are arsenic, phosphorus or antimony. The implantation is performed at a low-energy level on the order of 10 to 100 keV, and preferably is 20 keV in order to prevent dopant penetration into channel region 53. The ion dose in this implantation step is on the order of 1E15 to 5E16/cm$^2$, and is preferably 5E15/cm$^2$. Etch-stop layer 52 may be left in gate trench area 62 until this implantation process is complete.

Following the implantation, a rapid thermal annealing (RTA) or furnace annealing process is performed. The RTA or furnace anneal redistributes the dopants in the thin lower gate region 50, and activates dopant atoms in LDD source/drain junction regions 58 and heavily doped source/drain junction regions 64. The RTA process is preferably performed at 1000° C. for 30 seconds. Furnace annealing may be used (instead of RTA) at, for instance, 900° C. for one hour. It should be noted that the thinness (on the order of 1000 angstroms) of lower gate region 50 permits a uniform and high-concentration distribution of dopants near gate/insulator interface 51 with the use of a low to moderate annealing step having a controlled temperature and duration. Thus, the simultaneous doping and subsequent thermal anneal steps permit silicon gate dopants to properly distribute within lower gate region 50, near gate/insulator interface 51 and LDD source/drain junction regions 58, as well as permitting source/drain junction regions 64 to become fully activated without a significant junction dopant redistribution. As a result, the prior art problems, discussed earlier, of requiring excessive annealing temperatures, duration and implantation energies for effective doping of thick polysilicon gates are eliminated by utilizing a thinner lower gate region 50.

An anisotropic (or timed isotropic) oxide etch is performed which removes the exposed portions of gate insulating layer 48 (see FIG. 6). The plasma oxide etch further removes interim gate etch-stop layer 52 in gate trench area 62.

Figure 8:
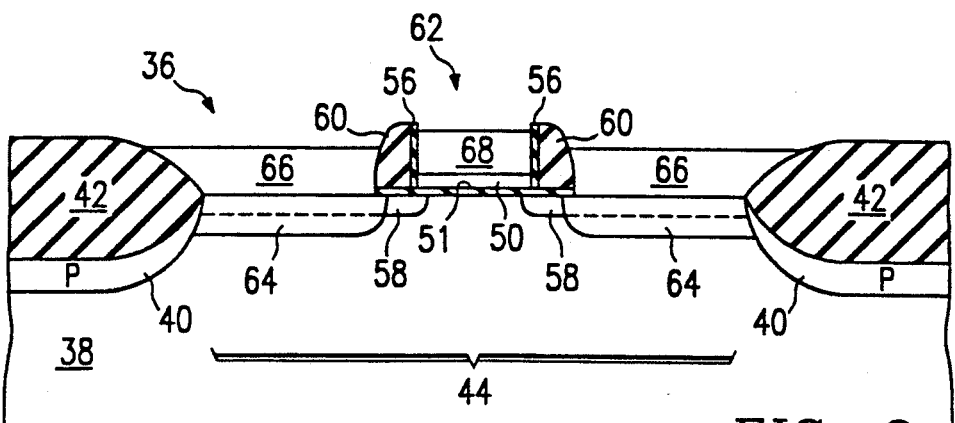
FIG. 8 illustrates a cross-sectional view of the present invention including elevated source/drain junction regions and a permanent upper gate region formed from a selective semiconductor growth (SSG) process.

FIG. 8 illustrates a cross-sectional view of transistor structure 36 after the formation of elevated source/drain junction regions 66 and permanent upper gate semiconductor region 68. A selective semiconductor growth (SSG) process is preferably used to form elevated source/drain junction regions 66 overlying heavily doped source/drain junction regions 64. The SSG process simultaneously causes formation of permanent upper gate semiconductor region 68 in gate trench area 62. The SSG process may be performed in an epitaxial semiconductor growth reactor using selective deposition process chemistry such as $SiH_2Cl_2$ (DCS) with HCl and $H_2$ for selective silicon deposition. As a result of the SSG process, there is a self-aligned selective deposition of undoped silicon (or germanium or silicon-germanium alloy) thereby forming elevated source/drain junction regions 66 and permanent upper gate region 68. Each of elevated source/drain junction regions 66 and permanent upper gate region 68 may be formed on the order of 4000 angstroms in thickness. In the current example, silicon is the selectively grown semiconductor material because the material underlying regions 66 and 68 is also silicon. It should be understood, however, that alternative semiconductor materials (e.g. germanium or silicon-germanium alloy) may be grown in accordance with silicon substrate or alternative types of underlying semiconductor materials.

It should be noted that the quality of the semiconductor layer deposited by the SSG process is not a critical factor which will affect device performance. The SSG layer filling gate trench area 62 may be either amorphous or polycrystalline silicon. Moreover, the SSG layer deposited simultaneously on top of heavily-doped source/drain junction regions 64 may be amorphous polycrystalline, or single-crystal silicon or germanium or silicon-germanium alloy. The type of semiconductor material layer deposited on various parts of a patterned semiconductor substrate depend on various factors such as surface morphology, surface defects, and type of underlying layer. For instance, the polycrystalline nature of lower gate region 50 will ensure that the SSG refill material for permanent upper gate regions 68 will be either amorphous or polycrystalline. However, the heavily doped source/drain junction regions 64 are single-crystal and, as a result, the process and silicon surface characteristics will determine the type of silicon material layer for elevated source/drain junction regions 66 (single-crystal, polycrystalline, or amorphous). The SSG process parameters are optimized in order to eliminate any pattern-dependent kinetics (i.e. microloading) effects and faceting. These considerations usually imply that the SSG process should be performed in the kinetic-limited or reacting-limited deposition regions (e.g. at T≦900° C. and low pressures).

The SSG layer may be deposited as undoped semiconductor, and subsequently, ion implanted either before or after the formation of self-aligned silicided regions as discussed below. The subsequent doping may be accomplished by performing an n+ (e.g. arsenic or phosphorus) ion implantation on the order of 1E15 to 1E16/cm$^2$ at an energy level of 40 to 100 keV. Thereafter, the device is annealed by RTA, for instance, at 1000° C. for 15 to 100 seconds. An in-situ doping process at a level on the order of 5E18 to 5E21/cm$^3$, and preferably at 5E20/cm$^3$, may be used as an alternative to depositing undoped silicon. In-situ doping is permitted because the heavy doping level of elevated source/drain junction regions 66 and permanent upper gate region 68 is not as critical as it is near gate conductor-/insulator interface 51. The choice of in-situ doping during the SSG process or ion implantation doping depends on various process considerations.

Figure 9:
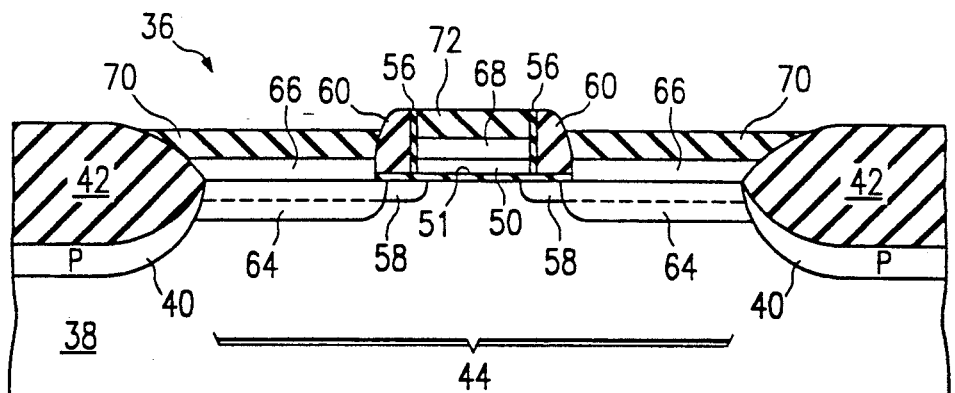
FIG. 9 illustrates a cross-sectional view of the present invention having reacted refractory metal (preferably silicide) transistor contacts.

FIG. 9 illustrates a cross-sectional view of transistor structure 36 after the formation of reacted refractory metal contacts 70 and 72. Reacted refractory metal contacts 70 and 72 are formed over elevated source/drain junction regions 66 and permanent upper gate region 68, respectively. Typically, reacted refractory metal contacts 70 and 72 are on the order of 1000 to 3000 angstroms in thickness. Reacted refractory metal contacts 70 and 72 are preferably formed by a self-aligned silicide or "SALICIDE" process which involves the sputter deposition of titanium or other refractory metals followed by an RTA in a nitrogen or ammonia ambient. The RTA forms silicide contacts over gate, source, and drain regions due to the reaction, and consumption, of titanium with the underlying exposed semiconductor (i.e., silicon in the example). Reacted refractory metal nitride and some unreacted refractory metal are left over the insulating surfaces, including field insulating regions 42 and sidewall spacer 60 regions. After the initial RTA, both unreacted titanium and reacted titanium nitride (not shown) may be selectively etched and removed with a plasma and/or wet etch process. Thereafter, a second RTA may be performed in order to cause reacted refractory metal contacts 70 and 72 to have a lesser electrical resistivity (and also complete stoichiometric silicide formation over gate and source/drain junction regions).

The present example specifies a silicide material which is the reaction product of the refractory metal with the underlying silicon. It should be noted, however, that reacted refractory metal contacts 70 and 72 may comprise alternative reactive products where a refractory metal reacts with other types of alternative semiconductor materials (e.g. germanium or silicon-germanium).

The process steps discussed hereinabove describe a novel fabrication methodology for constructing a new transistor structure. The following discussions provide numerous other considerations which may be implemented in constructing alternative embodiments of the present invention, or may be used in addition hereto for interconnecting a transistor fabricated in accordance with the present invention to other devices proximate thereto.

FIGS. 10 through 14 represent alternative process steps which may be used in lieu of FIGS. 3 through 6, discussed above. The processes discussed in connection with FIGS. 10 through 14 eliminate the need for the carefully controlled anisotropic etch having a high nitride-to-oxide selectivity for insulating spacers 60 as discussed above in connection with FIG. 5. The original insulating spacer formation process of this invention as related to FIG. 5 requires careful optimization of the anisotropic spacer dielectric (silicon nitride) etch process parameters (selectivity for nitride spacer layer etch to gate oxide layer 48) in order to prevent removal of the extensions of gate insulating layer 48 which overlie source/drain surface junction regions 58. The considerations of FIGS. 10 through 14 will ensure that a subsequent isotropic silicon etch process (to remove disposable upper gate electrode 54) will not attack and remove the LDD source/drain semiconductor junction regions.

Figure 10:
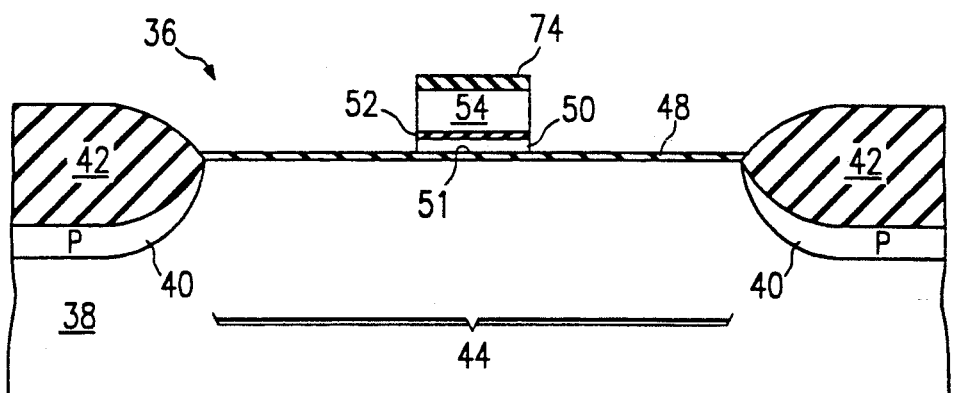
FIG. 10 illustrates a cross-sectional view of an alternative initial gate structure having a pad silicon nitride overlayer formed thereon.

FIG. 10 illustrates a cross-sectional view of transistor structure 36 of the present invention having a multilayer stacked gate structure similar to that of FIG. 3, but further including a thin silicon nitride pad overlayer 74 formed thereover. Silicon nitride pad overlayer 74 is formed on top of the stack by using an LPCVD or PECVD process to deposit a layer of nitride on the order of 100 to 1000, and preferably 400, angstroms, in thickness. Accordingly, a four-layer stack of materials exists rather than three layers as discussed in connection with FIG. 3. A subsequent photolithographic patterning and in-situ anisotropic gate etch yields a patterned stack of four layers as shown in FIG. 10. These layers include lower gate region 50, interim gate etch-stop region 52, disposable upper gate region 54 and pad nitride overlayer 74 (used later on as an oxidation mask).

Figure 11:
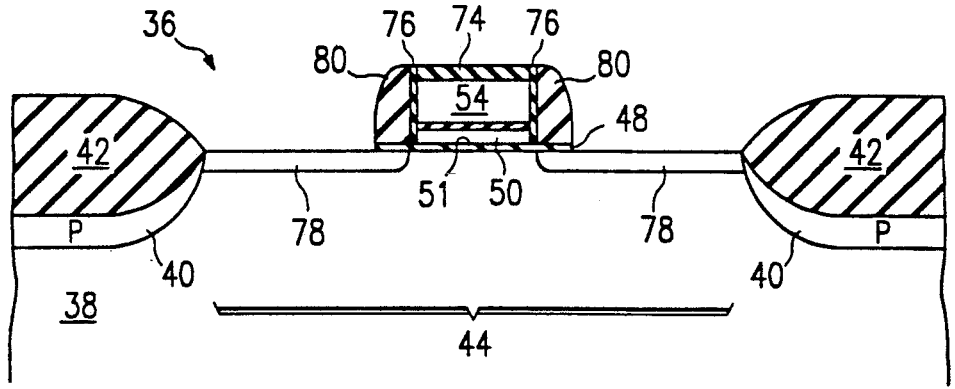
FIG. 11 illustrates a cross-sectional view of an alternative embodiment having insulating sidewall spacers and the gate pad nitride overlayer.

FIG. 11 illustrates a cross-sectional view of transistor structure 36 of FIG. 10 following the formation of initial sidewall spacers 76, LDD source/drain junction regions 78 and secondary sidewall spacers 80. Sidewall spacers 76 are formed in the same fashion as sidewall spacers 56 discussed above in connection with FIG. 4. Thus, a sidewall oxide on the order of 100 angstroms in thickness is formed either by growing the oxide or depositing and subsequently etching an oxide layer. LDD source/drain junction regions 78 are formed in the same fashion as LDD source/drain junction regions 58 discussed above in connection with FIG. 4. Thus, LDD source/drain junction regions 78 are formed by n-type (arsenic, phosphorus or antimony) ion implantation at a dosage on the order of 5E12 to 1E14/cm$^2$, and preferably 5E13/cm$^2$. The energy level for implantation is 10 to 50 keV, and preferably 20 keV.

Secondary sidewall spacers 80, however, unlike secondary sidewall spacers 60 of FIG. 5, are constructed using silicon oxide rather than silicon nitride. An LPCVD or PECVD process is used to deposit a layer of oxide on the order of 500 to 3000, and preferably 1500, angstroms, in thickness. An RIE is performed with selectivity between oxide and silicon on the order of 20 to 1, and selectivity between oxide and nitride on the order of 4 to 1 in order to prevent nitride pad overlayer 74 from being completely removed during the etch. It should be noted that an RIE process with a long over etch causes the exposed portions of insulating layer 48 to be removed thereby exposing LDD source/drain junction regions 78 (particularly if a large RIE over-etch time is used to ensure complete removal of excess silicon oxide from substrate surface).

Figure 12:
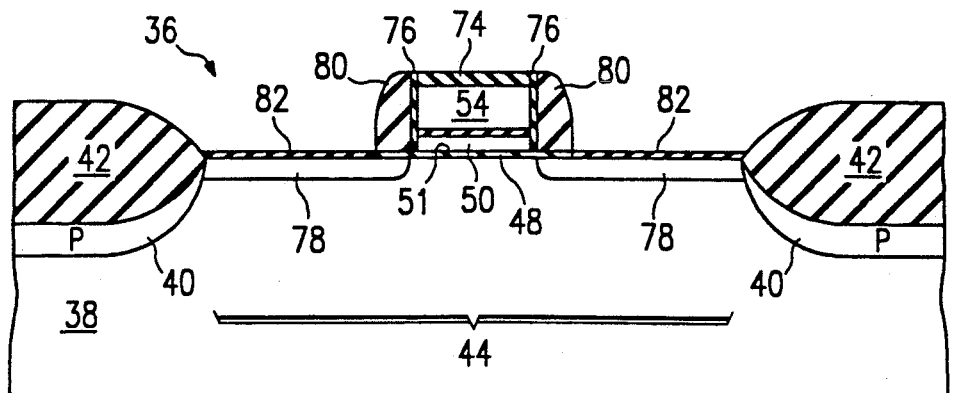
FIG. 12 illustrates a cross-sectional view of the transistor of FIG. 11 having regrown insulator segments overlying the implanted source/drain junction regions.
Figure 13:
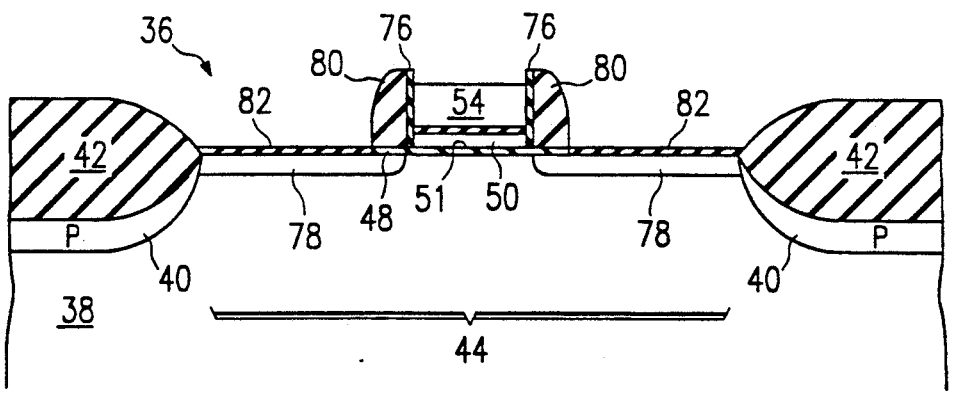
FIG. 13 illustrates a cross-sectional view of the alternative embodiment of FIG. 12 following removal of the gate pad nitride overlayer.

FIG. 12 illustrates a cross-sectional view of transistor structure 36 of FIG. 11 following the formation of regrown insulator segments 82. An oxidation process grows insulator segments 82 on the order of 100 angstroms in thickness over LDD source/drain junction regions 78. It should be noted that nitride pad 74 protects and masks disposable upper gate region 54 from the oxidation ambient during the thermal oxidation process used for oxide regrowth to form insulator segments 82. Accordingly, the structure shown within FIG. 13 is essentially similar to that of FIG. 5. The significant difference is that secondary sidewall spacers 80 are of an oxide material rather than a nitride material as is the case with secondary sidewall spacers 60 shown in FIG. 5.

FIG. 13 illustrates a cross-sectional view of transistor structure 36 following selective removal of nitride pad overlayer 74. An isotropic and selective etch is used to remove nitride pad overlayer 74, thereby exposing disposable upper gate region 54. It should be noted that the isotropic nitride etchant generally attacks nitride and does not remove any of the oxide regions such as sidewall spacers 76, secondary sidewall spacers 80 and regrown insulator segments 82.

Figure 14:
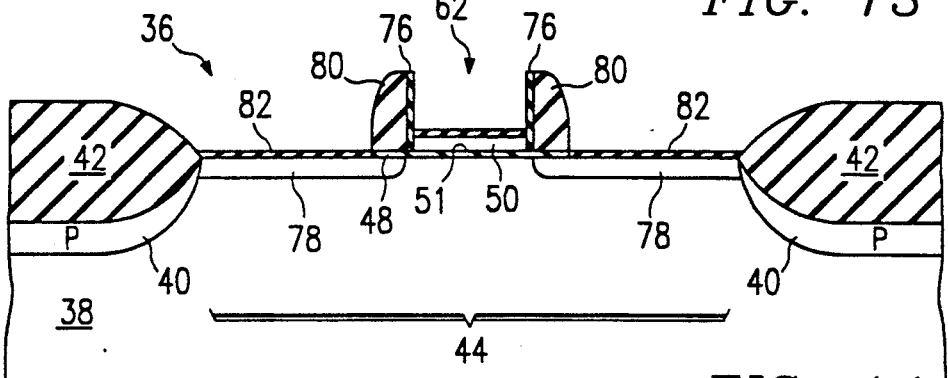
FIG. 14 illustrates a cross-sectional view of the embodiment of FIG. 13 following removal of the disposable upper gate region.

FIG. 14 illustrates transistor structure 36 following the complete selective removal of previously existing disposable upper gate region 54. After the formation of secondary sidewall spacers 80, an isotropic etch is performed. This etching process removes disposable upper gate region 54 (see FIG. 13). The etch stops on interim gate etch-stop region 52 and defines a gate trench area 62 between sidewall spacers 76 and over interim gate etch-stop region 52. The remaining processing steps discussed in connections with FIGS. 7 through 9 may then be performed in order to construct a transistor device in accordance with the present invention.

If necessary, the fabrication method of this invention can be further modified (another embodiment of this invention) in order to fabricate a device with efficiently and uniformly doped gate electrode and without formation of elevated source/drain junction regions. Referring to FIG. 6, this can be achieved by selective removal of the thin gate etch-stop layer 52 and without complete removal of gate insulating layer 48 where it extends over source/drain junction regions 58. For instance, if etch-stop layer 52 is a 20-Å thick oxide, and the gate insulating layer extension over regions 58 is a 100-Å thick oxide, etch-stop layer 52 can be removed easily with a timed isotropic oxide etch (even with as much as 100% overetch) without complete removal of the gate insulating layer extensions. As a result, during a subsequent SSG process, selective silicon is only deposited in gate trench region 62 to form the permanent upper gate region 68. No elevated source/drain junction regions are formed over LDD source/drain junction regions 58 due to the dielectric masking effects of the remaining gate insulating layer overlying LDD source/drain junction regions 58.

The alternative above-mentioned embodiment also allows formation of elevated source/drain junction regions after a first gate trench refill. This can be done by breaking the original SSG process into two (or more) separate SSG steps. The first SSG process is performed after removal of the gate etch-stop layer 52, while insulating layer 48 remains over LDD source/drain regions 58. This first SSG process is timed to partially fill gate trench region 62. Thereafter, insulating layer 48 is removed from over LDD regions 58 by an anisotropic oxide etch. A second SSG process is preferred which completes the gate trench 62 refill and forms thinner elevated source/drain junction regions over source/drain junction regions 58. A subsequent n+ ion implantation and anneal is performed to dope the top portion of the gate electrode and to form the n+ source/drain junction regions. This process sequence allows formation of thinner elevated source/drain junction regions independent of the final gate electrode height.

Figure 15:
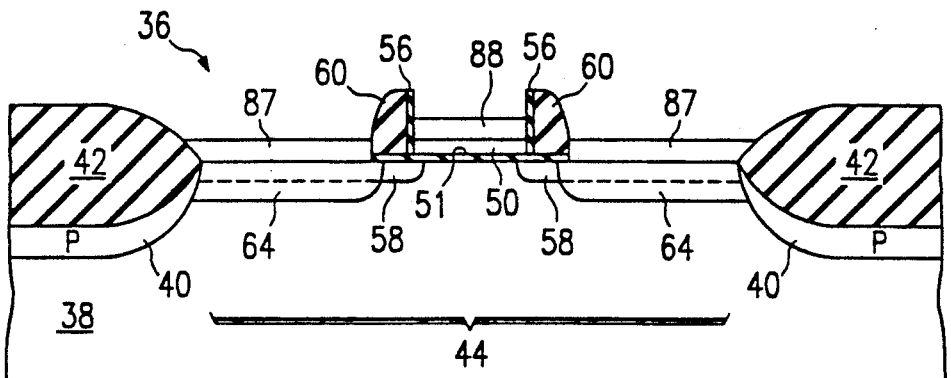
FIG. 15 illustrates a cross-sectional view of the alternative embodiment after removal of the gate etch-stop and source/drain insulator layers and after forming the primary elevated source/drain junction regions and a secondary upper gate region.

FIGS. 15 through 19 illustrate a novel process and structure for interconnecting a transistor constructed in accordance with the present invention to other devices proximate thereto. In particular, FIG. 15 illustrates an alternative cross-sectional view of transistor structure 36 shown in FIG. 8. Instead of forming elevated source/drain junction regions with a single semiconductor layer on the order of 4000 angstroms by SSG, two steps are used for the embodiment of FIG. 15 to provide a suitable configuration for implementing a novel interconnect scheme. In particular, the first step involves a first SSG, preferably of silicon, on the order of 2000 angstroms in thickness (i.e. approximately one-half of the total desired 4000 angstrom thickness of the silicon discussed in connection with FIG. 8). Again, the semiconductor may be amorphous silicon, polysilicon, single-crystal silicon, germanium, or silicon-germanium alloy. This first SSG forms primary elevated source/drain junction regions 87 and a primary upper gate region 88. Further, the silicon may be doped in-situ, or grown as undoped silicon followed by a subsequent doping step. A second SSG step is discussed below in connection with FIG. 17.

Figure 16:
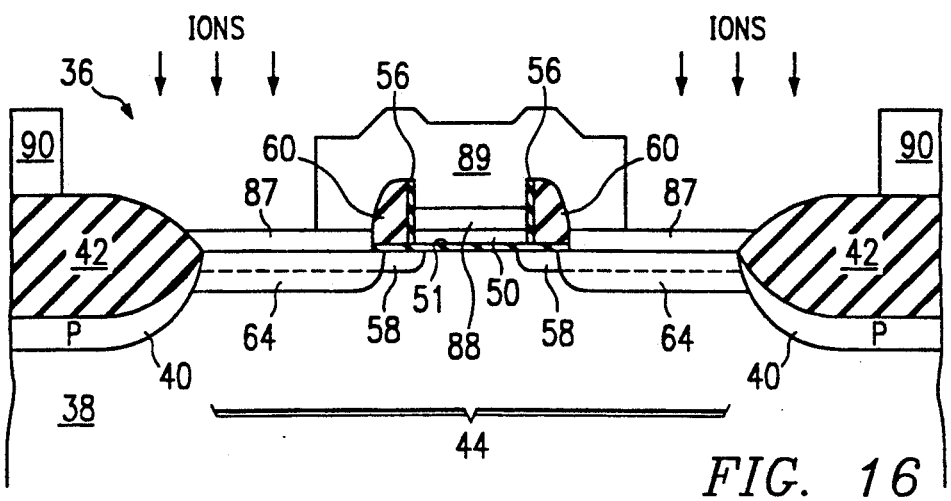
FIG. 16 illustrates a cross-sectional drawing of a transistor having a patterned local interconnect photoresist or hard mask thereon for masked ion implantation.

FIG. 16 illustrates a cross-sectional view of transistor structure 36 of FIG. 15 having a patterned photoresist or hard mask 89 and 90 disposed thereon. Photoresist or hard mask 89 and 90 is a negative image mask made from an interconnect mask, and therefore exposes areas of transistor structure 36 and field insulating regions 42 where it is desired for reacted refractory metal interconnections to be made. If a hard mask is used, materials such as PSG, BSG, or BPSG are preferred. A low energy ion implantation is then performed. The implantation is preferably of silicon or germanium ions at a dosage of 1E13 to 1E16/cm$^2$ and an energy level less than 50 keV. The light ion implantation causes slight surface damage in the implanted regions including over field insulating regions 42, and implants unbonded semiconductor atoms at the surface therein. In particular, the masked ion implantation process modifies the surface structure of field insulating regions 42 where the implanted ions are deposited. Field insulating regions 42 are modified at their surface according to the interconnecting pattern due to a combination of the following phenomena: first, the low-energy implanted ions (silicon, argon, helium, or germanium; preferably germanium) break the Si—O bonds at the surface and cause surface damage; and second, implanted Si or Ge atoms are deposited near the masked implanted surface regions and provide additional unbonded (or loosely bonded) semiconductor atoms. An alternative ion implantation process may implant inert species such as argon or helium instead of silicon or germanium.

Figure 17:
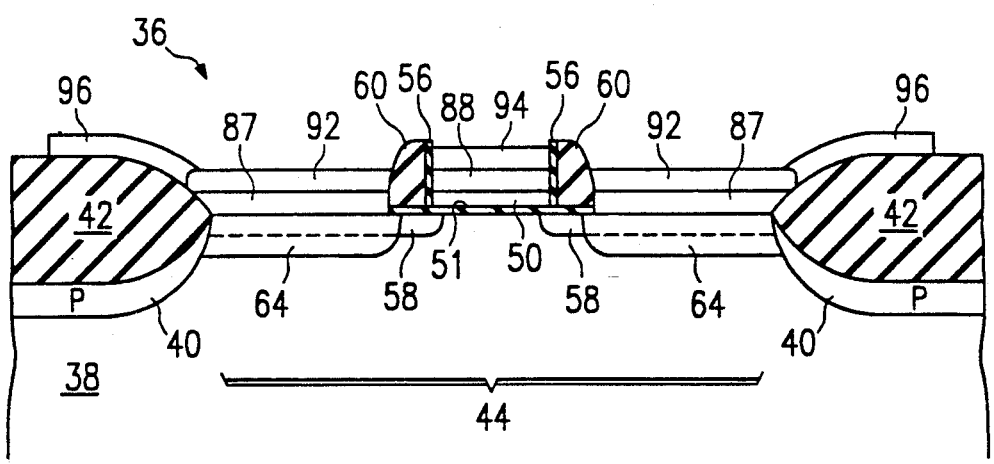
FIG. 17 illustrates a cross-sectional drawing of a transistor having secondary elevated source/drain junction regions, a primary secondary upper gate region, as well as local interconnect semiconductor extension segments.

FIG. 17 illustrates a cross-sectional view of transistor structure 36 shown in FIG. 16 following the formation of secondary elevated source/drain junction regions 92, a secondary upper gate region 94 and semiconductor interconnect segments 96. Photoresist or hard implant mask layer 89 and 90 is stripped. A second SSG of undoped or doped semiconductor material is performed. Preferably, the semiconductor material deposited on implanted field insulating regions 42 is amorphous silicon or polysilicon or germanium or silicon-germanium alloy. The second SSG performs three functions. First, the gate for transistor structure 36 is completed because secondary upper gate region 94 is formed thereby providing a complete gate in combination with primary upper gate region 88 and lower gate region 50. Second, secondary elevated source/drain junction regions 92 are formed thereby completing the elevated source/drain junction regions in combination with primary elevated source/drain junction regions 87. Third, the SSG forms semiconductor interconnect segments 96 because semiconductor is deposited over field insulating regions 42 due to the implantation of ions discussed in connection with FIG. 16.

As a result of the SSG process following the removal of the ion implantation mask 89 and 90, semiconductor is not only deposited on the exposed semiconductor of source/drain and gate regions 92 and 94, but also semiconductor deposition occurs on the implanted regions of the field insulating regions 42 and any other implanted insulator surface. Using a proper interconnection mask pattern, this process will result in formation of semiconductor interconnect segments 96 connected directly to the source, drain, and/or gate electrode regions (wherever needed).

Figure 18:
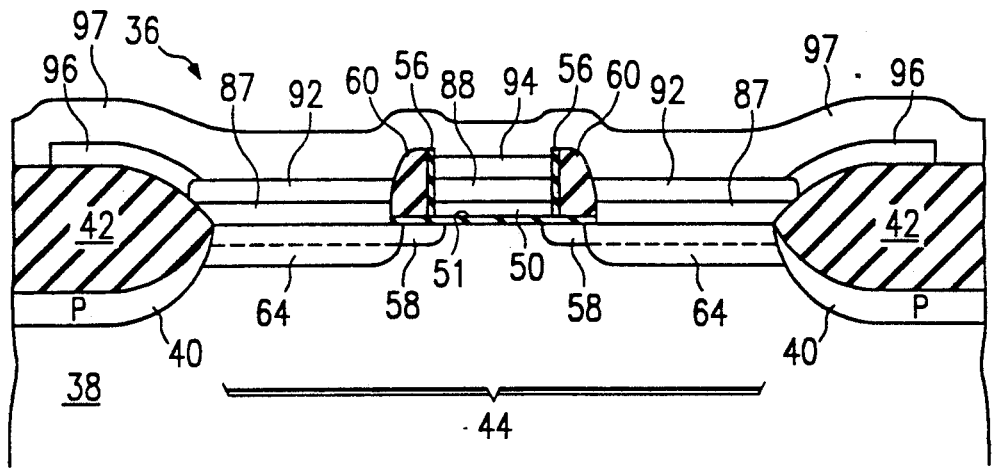
FIG. 18 illustrates a cross-sectional view of the present invention having refractory metal disposed thereon.

FIG. 18 shows a cross-sectional view of transistor structure 36 of FIG. 17 after blanket deposition of a refractory metal layer and before the annealing process. Refractory metal layer 97 may be reacted as discussed below in order to provide contact to the gate and/or source/drain junction regions of transistor 36.

Figure 19:
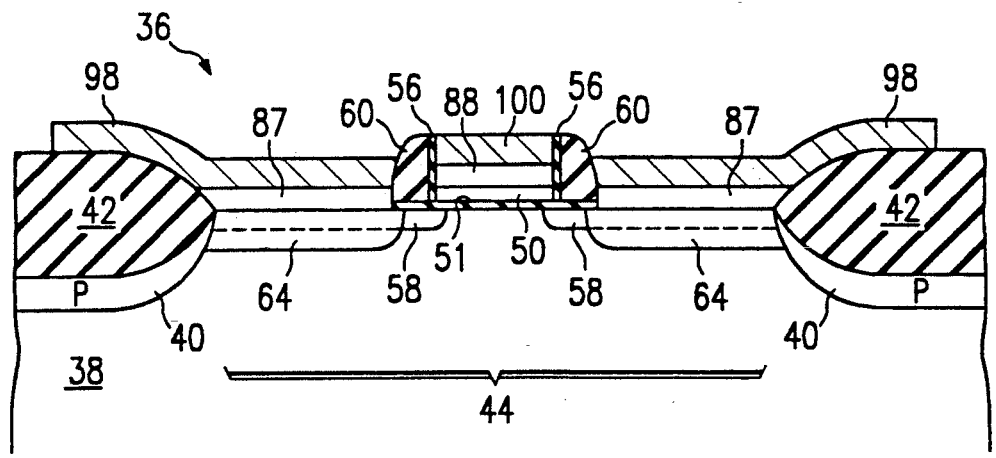
FIG. 19 illustrates a cross-sectional drawing of a transistor having low-resistance reacted refractory metal local interconnect segments extending over the field insulating regions and connecting to the source/drain junction and gate electrode regions.

FIG. 19 illustrates a cross-sectional view of transistor structure 36 of FIG. 18 following the formation of reacted refractory metal interconnect segments 98 and 100 (no connection is shown for segment 100 over gate conductor 88). Reacted refractory metal interconnect segments 98 and 100 are preferably formed in a three-step process. An RTA or furnace anneal is performed in order to form reacted refractory metal where the refractory metal reacts with a semiconductor substance in contact therewith. It should be noted that FIG. 19 illustrates a complete reaction and consumption of the refractory metal with semiconductor segments 96, secondary elevated source/drain junction regions 92 and secondary upper gate region 94 (see FIG. 18). This complete consumption, however, is not necessary, but is merely shown for illustrative purposes.

The excess unreacted refractory metal and reacted refractory metal nitride are then removed by a selective etching process. Finally, a second RTA or furnace anneal is performed in order to further lessen the electrical resistivity of refractory metal interconnect segments 98 and 100 and improve the silicide stoichiometry.

From a review of FIGS. 17 and 18, it may be appreciated that the semiconductor material, of semiconductor excess segments 96, secondary elevated source/drain junction regions 92 and secondary upper gate region 94, provides an underlying material to react with refractory metal layer 97 to form "reacted refractory metal" contacts to transistor 36. In other words, reacted refractory metal contacts form wherever semiconductor material was previously formed. This reaction is a self-aligned process to form any desired interconnect to transistor 36. Further, if necessary, the interconnect masks 89 and 90 (see FIG. 16) may be structured to allow ion implantation into any of the sidewall spacer regions in order to grow semiconductor segments over these regions. This process will provide semiconductor material, and subsequently formed reacted refractory metal contacts between gate-to-source and/or gate-to-drain of the transistor.

The local interconnect process described in this invention provides patterned reacted refractory metal such as silicide layers as local interconnection lines. This is preferred over the prior art refractory metal nitride local interconnects due to the lower electrical resistivity of silicide compared to refractory metal nitride, and also due to its improved compatibility with a large number of metals (more refractory metal silicides than nitrides can be formed and used as good electrical conductors). The process fabrication of this invention employs two separate SSG processes in order to allow independent optimization of the elevated source/drain junctions and gate electrode formation as well as the reacted refractory metal interconnects with fully consumed semiconductor layers. The overall process results in a fairly planar device structure and reduced chip surface topography. If desired, the two SSG processes can be combined into one SSG process in order to reduce processing complexity. However, this will make the thickness of the semiconductor layer grown over the insulating field regions for subsequent silicide interconnects equal to the thickness of elevated source/drain junction regions. There will be also some effects on the overall device surface topography.

It should be noted that the local interconnect mask and ion implantation process provide allowance for implant overlap between the insulating region where a semiconductor segment will be formed and the connecting device terminal region (gate, source, and drain). For instance, to form silicide local interconnection segments 96 to connect to the source and drain regions of the device, the ion implantation is allowed to overlap the exposed source/drain junction regions sufficiently such that a proper formation and extension of the segment over the field insulating surface and at its edge is ensured. The implanted atoms in the exposed source/drain junction regions and/or exposed gate region have essentially no effect on subsequent SSG process and semiconductor depositions in those exposed areas. Moreover, the fabrication process sequence of this invention allows complete reacted refractory metal formation over the gate, source/drain junction and local interconnection segment regions. The refractory metal nitride and any excess refractory metal material left on the insulating surfaces (which do not provide any semiconductor layer formed by SSG) can be easily removed by an isotropic wet or dry etch process which is selective against silicide and insulating layer materials. This type of etch process is fairly easy to develop (as apposed to the conventional local interconnect techniques where other issues such as refractory metal nitride undercut have to be considered).

From the above, it may be appreciated that the present invention provides a novel and practical process and structure involving the construction and interconnection of a transistor device. A transistor fabricated and interconnected in accordance with the present invention includes shallow source/drain junction regions and a gate conductor having a high concentration and uniform distribution of dopants near the gate conductor/gate insulator interface. Further, the present invention provides an option to fabricate elevated source/drain transistors having benefits associated with simultaneously doping the source/drain junction regions and gate conductor. Additionally, the novel interconnect scheme provided in accordance with the present invention permits the formation of local interconnects utilizing reacted refractory metals with semiconductor underlayers and therefore eliminates the need for using refractory metal nitrides or high electrical resistance interconnects.

The present invention has been discussed in connection with the formation of an NMOS device, but again it should be understood that the same may be constructed in a PMOS environment if the dopant types are properly modified. Further, the provision of an elevated source/drain device is the preferred embodiment, but it should be understood that the present invention may also be used with standard transistor devices having source/drain junction regions solely within the semiconductor substrate (or well) in which the device is constructed. If desired, the device fabrication flows of this invention can be properly and easily modified in order to form the elevated source/drain and shallow LDD junctions prior to formation of the secondary thicker sidewall spacers. This option will allow formation of ultrashallow LDD source/drain junction regions in accordance with the device structure of this invention and based on a 2-step (or even 1-step) SSG process. Still further, while the present invention has been described in detail, it should be understood that various changes, substitutions and alterations can be made hereto without departing from the spirit and scope of the invention as defined by the appended claims.

What is claimed is:

1. A method of forming a transistor, comprising the steps of:
    forming an insulating layer adjacent a semiconductor region;
    forming a first gate conductor region adjacent the insulating layer and opposite the semiconductor region; and
    forming implanted source/drain regions within the semiconductor region by simultaneously implanting dopants into the gate conductor region and the semiconductor region;
    forming a second gate conductor region adjacent the first gate conductor region;
    forming elevated source/drain regions adjacent and overlying the implanted source/drain regions, wherein the elevated source/drain regions comprise a first pair of elevated doped source/drain regions;
    forming a second pair of elevated source/drain regions overlying the first pair of elevated source/drain regions; and
    forming a reacted refractory metal layer contacting at least one of the second pair of elevated source/drain regions.

2. The method of claim 1 wherein the implanted source/drain regions comprise heavily doped source/drain regions, and further comprising forming lightly-doped source/drain regions.

3. The method of claim 1 and further comprising forming a semiconductor interconnect region contacting at least one of the elevated source/drain regions.

4. The method of claim 1 wherein the gate conductor includes sidewalls, and further comprising forming sidewall spacers adjacent the sidewalls of the gate conductor.

5. The method of claim 4 wherein the sidewall spacers comprise a first pair of sidewall spacers, and further comprising forming a second pair of sidewall spacers.

6. The method of claim 5 wherein said step of forming the insulating layer comprises forming an oxide insulating layer, and wherein said step of forming a second pair of sidewall spacers comprises forming oxide sidewall spacers.

7. The method of claim 5 wherein said step of forming a second pair of sidewall spacers comprises forming nitride sidewall spacers.

8. The method of claim 1 and further comprising forming a reacted refractory metal contact overlying the gate conductor.

9. The method of claim 1 and further comprising annealing the gate conductor region and implanted source/drain regions.

10. The method of claim 1 and further comprising:
    covering selected regions of the transistor with a mask such that an area where an interconnect is to be formed is exposed; and
    implanting non-dopant ions into the exposed area subsequent to forming said implanted source/drain regions.

11. The method of claim 10 wherein said step of implanting non-dopant ions comprises implanting semiconductor ions.

12. The method of claim 10 wherein said step of implanting non-dopant ions comprises implanting inert ions.

13. The method of claim 10 and further comprising:
    removing the mask; and
    forming a semiconductor interconnect region in the exposed area.

14. The method of claim 13 wherein said step of forming a semiconductor interconnect region comprises selectively growing a semiconductor interconnect region.

15. The method of claim 13 and further comprising forming a reacted refractory metal contact in the exposed area.

16. The method of claim 15 wherein said step of forming a reacted refractory metal contact comprises:
    sputtering refractory metal over the exposed areas; and
    annealing the refractory metal such that it reacts with the semiconductor interconnect region.

17. The method of claim 15 wherein said step of forming a reacted refractory metal contact comprises:
    depositing refractory metal by chemical-vapor deposition over the exposed area; and
    annealing the refractory metal.

18. The method of claim 15 and further comprising annealing the reacted refractory metal contact to reduce the electrical resistivity thereof.

19. The method of claim 1 and further comprising:
    forming an etch stop layer adjacent the first gate conductor and opposite the first insulating layer; and
    forming a disposable gate region adjacent the etch stop layer and opposite the first gate conductor.

20. The method of claim 19 and further comprising:
    forming a nitride pad layer adjacent the disposable gate region and opposite the etch stop layer, wherein the first gate conductor, the etch stop layer and the disposable gate region include sidewalls;
    forming sidewall spacers adjacent the sidewalls; and
    forming oxide sidewall spacers adjacent the sidewall spacers.

21. A method of forming a transistor, comprising the steps of:
    forming an insulating layer adjacent a semiconductor region and having sidewalls;
    forming a first gate conductor region having sidewalls adjacent the insulating layer and opposite the semiconductor region;
    forming an etch stop layer having sidewalls adjacent the first gate conductor and opposite the first insulating layer;

forming a disposable gate region having sidewalls adjacent the etch stop layer and opposite the first gate conductor;

forming sidewall spacers adjacent the sidewalls of the insulating layer, gate conductor region, etch stop layer and disposable gate region;

forming implanted source/drain regions within the semiconductor region by simultaneously implanting dopants into the gate conductor region and the semiconductor region;

forming elevated source/drain regions adjacent and overlying the implanted source/drain regions, wherein the elevated source/drain regions comprise a first pair of elevated doped source/drain regions;

forming a second pair of elevated source/drain regions overlying the first pair of elevated source/drain regions; and forming a reacted refractory metal layer contacting at least one of the second pair of elevated source/drain regions.

22. The method of claim 21 and further comprising:
removing the etch stop layer; and
forming a second gate conductor region adjacent the first gate conductor region.

23. The method of claim 22 wherein said step of forming the second gate conductor region comprises selective semiconductor growth of the second gate conductor region.

24. The method of claim 21 and further comprising:
forming a nitride pad adjacent the disposable gate region and opposite the etch stop layer, and wherein the sidewall spacers comprise oxide and nitride sidewall spacers.

25. The method of claim 21 wherein the implanted source/drain regions comprise heavily doped source/drain regions, and further comprising forming lightly-doped source/drain regions.

26. The method of claim 21 and further comprising:
forming semiconductor interconnect regions contacting the elevated source/drain regions; and
forming reacted refractory metal layer contacting the elevated source/drain regions.

27. The method of claim 21 and further comprising forming a reacted refractory metal layer overlying the gate conductor.

28. The method of claim 21 wherein the transistor is included within an integrated circuit, and further comprising:
covering a selected region of the integrated circuit with a mask such that an area where an interconnect is to be formed is exposed; and
implanting non-dopant ions into the exposed area subsequent to forming said implanted source/drain regions;
removing the mask;
forming a semiconductor interconnect region in the exposed area; and
forming a reacted refractory metal contact in the exposed area.

29. The method of claim 28 wherein said step of implanting non-dopant ions comprises implanting semiconductor ions.

30. The method of claim 28 wherein said step of implanting non-dopant ions comprises implanting inert ions.

31. The method of claim 28 and further comprising annealing the reacted refractory metal contact to reduce the electrical resistivity thereof.

* * * * *